US007935607B2

(12) United States Patent
Abrokwah et al.

(10) Patent No.: US 7,935,607 B2
(45) Date of Patent: May 3, 2011

(54) INTEGRATED PASSIVE DEVICE WITH A HIGH RESISTIVITY SUBSTRATE AND METHOD FOR FORMING THE SAME

(75) Inventors: Jonathan K. Abrokwah, Chandler, AZ (US); Keri L. Costello, Chandler, AZ (US); James G. Cotronakis, Chandler, AZ (US); Terry K. Daly, Gilbert, AZ (US); Jason R. Fender, Chandler, AZ (US); Adolfo G. Reyes, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 134 days.

(21) Appl. No.: 11/733,063

(22) Filed: Apr. 9, 2007

(65) Prior Publication Data
US 2008/0246114 A1      Oct. 9, 2008

(51) Int. Cl.
  *H01L 21/20* (2006.01)
(52) U.S. Cl. .................. 438/381; 257/E27.01
(58) Field of Classification Search .......... 438/381; 257/E27.01
  See application file for complete search history.

(56) References Cited

U.S. PATENT DOCUMENTS

| 4,961,767 | A  | * | 10/1990 | Schermerhorn et al. ...... 65/427 |
| 5,063,655 | A  | * | 11/1991 | Lamey et al. ............. 438/21 |
| 5,559,349 | A  | * | 9/1996  | Cricchi et al. ........... 257/273 |
| 6,388,290 | B1 | * | 5/2002  | Celler et al. ............ 257/350 |
| 6,444,517 | B1 | * | 9/2002  | Hsu et al. .............. 438/238 |
| 7,102,227 | B2 |   | 9/2006  | Terui |
| 2004/0147087 | A1 | * | 7/2004 | Cheng et al. ............. 438/396 |
| 2005/0040471 | A1 | * | 2/2005 | Harris et al. ............ 257/379 |
| 2005/0093397 | A1 | * | 5/2005 | Yamada et al. ........... 310/320 |
| 2005/0253255 | A1 | * | 11/2005 | Degani et al. ........... 257/724 |
| 2005/0263835 | A1 | * | 12/2005 | Sakama et al. ........... 257/411 |
| 2006/0128137 | A1 | * | 6/2006 | Furukawa et al. ......... 438/618 |
| 2006/0189068 | A1 | * | 8/2006 | Larkin et al. ............ 438/238 |
| 2007/0210866 | A1 | * | 9/2007 | Sato et al. ............. 330/126 |
| 2007/0215976 | A1 | * | 9/2007 | Degani et al. ........... 257/528 |

OTHER PUBLICATIONS

Dictionary Entry: "Harmonic Filter": Academic Press Dictionary of Science and Technology, 1992.*
Abrokwah, J.,et al.,"GaAs Integrated Passive Technology at Freescale Semiconductor", 2005 GaAs MANTECH Conference Digest.
Abrokwah, J.,et al.,"Flip-chip Low Band Harmonic Filter Based on GaAs Integrated Passives" 2006 GaAs MANTECH Technical Digest.
Liu, L., et al., "Compact Harmonic Filter Design and Fabrication using IPD Technology" 2005 Electronic Component and Technology Conference Digest.
"Thin Film Passive Devices", Prismark Wireless Technology Report, Aug. 2003.

* cited by examiner

*Primary Examiner* — Hsien-ming Lee
*Assistant Examiner* — Kevin Parendo
(74) *Attorney, Agent, or Firm* — Ingrassia Fisher & Lorenz, P.C.

(57) ABSTRACT

According to one aspect of the present invention, a method of forming a microelectronic assembly, such as an integrated passive device (IPD) (72), is provided. An insulating dielectric layer (32) having a thickness (36) of at least 4 microns is formed over a silicon substrate (20). At least one passive electronic component (62) is formed over the insulating dielectric layer (32).

17 Claims, 7 Drawing Sheets

INTEGRATED PASSIVE DEVICE WITH A HIGH RESISTIVITY SUBSTRATE AND METHOD FOR FORMING THE SAME

FIELD OF THE INVENTION

The present invention generally relates to a microelectronic assembly and a method for forming a microelectronic assembly, and more particularly relates to an integrated passive device (IPD) with a high resistivity substrate and a method for forming such an IPD.

BACKGROUND OF THE INVENTION

In recent years, wireless communication devices, such as cellular phones, have continued to offer an ever increasing amount of features to users, along with improved performance and computing power, while the overall size of the devices has continued to decrease. One important type of component found in such devices is referred to as "passive electronic components," including capacitors, resistors, and inductors. Often, these components work together to perform various electronic functions such as harmonic filtering, decoupling, impedance matching, and switching.

In years past, discrete passive electronic components were used in wireless communication devices and mounted to the various circuit boards and substrates within (i.e., "surface mount devices"). However, as performance demands continue to increase, while the overall size of the devices decreases, it is becoming increasingly difficult to fit all of the desired components into a single wireless device.

In recent years, integrated passive devices (IPDs) have been developed, in which the passive electronic components are formed directly onto substrates (e.g., wafers or microelectronic die), sometimes in conjunction with active electronic components, such as transistors. However, in order to optimize performance, IPDs are typically formed on relatively high resistivity substrates, such as those made of gallium arsenide, glass, quartz, or sapphire, as opposed to silicon, which is generally considered to have too low of a resistivity to be used in IPDs for wireless communication devices.

One problem associated with forming IPDs on such high resistivity substrates is that these materials are considerably more expensive than silicon. Additionally, the manufacturing tools and processes used to form integrated circuits (e.g., complementary metal-oxide semiconductor (CMOS) processing) on silicon substrates must be modified in order to use gallium arsenide, glass, quartz, or sapphire substrates, which further increases manufacturing costs, as well as production time.

Accordingly, it is desirable to provide a method for manufacturing IPDs on less expensive substrates, such as silicon, while providing a substrate with a suitable resistivity for use in wireless communication devices. Additionally, it is desirable to provide a method for manufacturing IPDs that utilizes the same processing tools and similar steps used to form integrated circuits with active electronic components. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-15 are merely illustrative and may not be drawn to scale.

FIG. 1 to FIG. 11 illustrate a method for forming an integrated passive device (IPD). A relatively thick oxide layer is formed on a high resistivity silicon substrate, and at least one passive electronic component is formed over the oxide layer. The combination of the thickness (i.e., at least 4 micrometers (μm)) of the oxide layer, along with the resistivity of the oxide material, increases the effective resistivity of the silicon substrate so that the substrate is suitable for use in IPDs used in, for example, wireless communications devices, as well as other radio frequency (RF) devices.

The oxide layer may be silicon oxide (e.g., silicon dioxide) with a thickness of between 4 and 20 μm. In one embodiment, the oxide layer is tetraethyl orthosilicate (TEOS) oxide with a thickness of between approximately 4 and 6 μm. The formation of the oxide layer may be performed at processing temperatures less than approximately 550° C., to ensure that the resistivity of the silicon substrate is not impaired.

Figure 1:
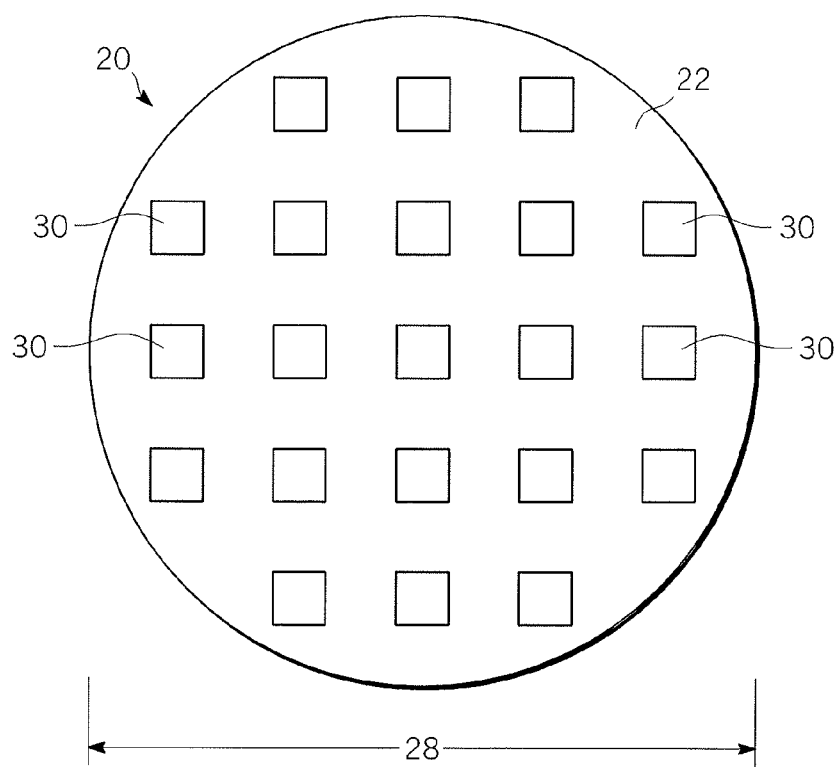
FIG. 1 is a top plan view of a semiconductor substrate.
Figure 2:
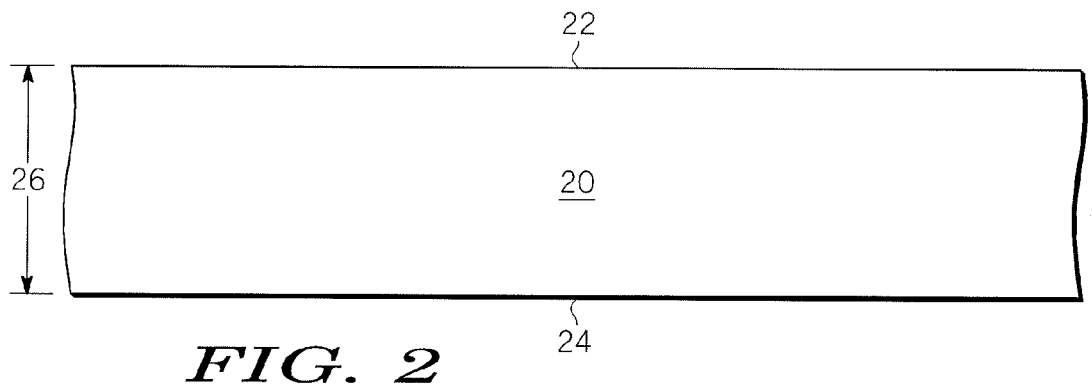
FIG. 2 is a cross-sectional side view of a portion of the semiconductor substrate of FIG. 1.

Referring to FIGS. 1 and 2, there is illustrated a semiconductor substrate 20. The semiconductor substrate 20 is made of a semiconductor material, such as silicon (Si). In a preferred embodiment, the substrate 20 is a silicon substrate with a resistivity of at least 1000 ohm-centimeters (cm), which may be referred to as a "high resistivity" substrate. As will be appreciated by one skilled in the art, the resistivity of the substrate 20 may be increased by purifying the silicon, such as by applying a magnetic field to the silicon during the formation of the ingot from which the substrate is cut. The substrate ingot may be grown by well known techniques, such as "floatzone", or liquid encapsulated Czochraski (LEC) techniques.

Still referring to FIGS. 1 and 2, the substrate 20 has an upper surface 22, a lower surface 24, and a thickness 26 of, for example, between approximately 25 and 800 micrometers (µm), preferably between 25 and 625 µm. In one embodiment, the upper surface 22 of the substrate is substantially planar and the thickness 26 of the substrate 20 is approximately 250 µm. In the depicted embodiment, the substrate 20 is a semiconductor wafer with a diameter 28 of, for example, approximately 150, 200, or 300 millimeters (mm). As illustrated specifically in FIG. 1, the substrate 20 may be divided into multiple die 30, or "dice," of integrated passives. Although not shown, in one embodiment, each of the dice 30 may include an at least partially formed integrated circuit, such as a microprocessor or a power integrated circuit, as is commonly understood, which may include numerous devices, such as transistors, formed therein. Although the following process steps may be shown as being performed on only a small portion of the substrate 20, it should be understood that each of the steps may be performed on substantially the entire substrate 20, or multiple dice 30, simultaneously. Furthermore, although not shown, it should be understood that the processing steps described below may be facilitated by the deposition and removal of multiple additional processing layers, such as photoresist, as is commonly understood.

Figure 3:
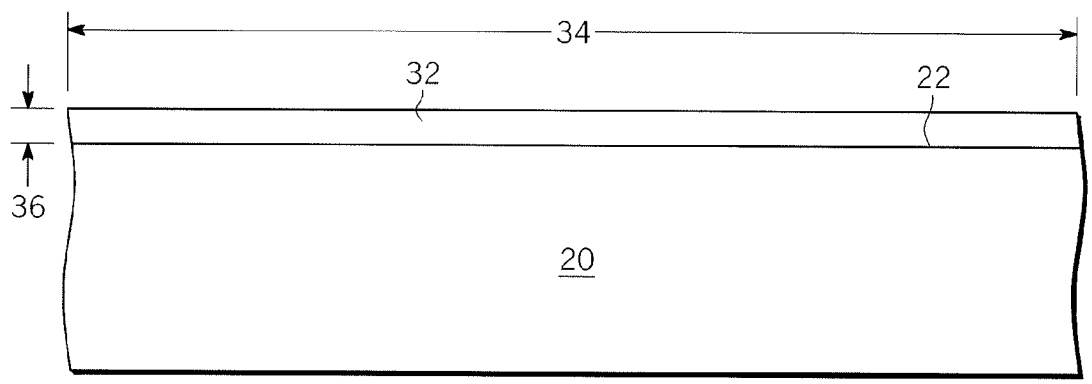
FIG. 3 is a cross-sectional side view of the semiconductor substrate of FIG. 2 with an oxide layer formed thereon.

Referring to FIG. 3, an insulating dielectric layer 32 is formed on (or over) the upper surface 22 of the substrate 20. In one embodiment, the insulating dielectric layer 32 includes an oxide material, such a silicon oxide formed using chemical vapor deposition (CVD). In a preferred embodiment, the insulating dielectric layer (or oxide layer) 32 is made of silicon dioxide ($SiO_2$) formed using plasma enhanced CVD (PECVD) in which tetraethyl orthosilicate, or tetraethoxysilane, (TEOS) is used as a silicon source to form TEOS oxide, as is commonly understood, on the upper surface 22. In one embodiment, the formation of the oxide layer 32 occurs, or is performed, at relatively low processing temperatures, such as 550° C or less, to ensure that the resistivity of the substrate 20 is not impaired. Such processing temperatures may be between 150° C. and 550° C. In a preferred embodiment, the formation of the oxide layer 34 occurs at processing temperatures between 150° C. and 450° C., such as approximately 350° C.

Still referring to FIG. 3, the oxide layer 32 has a width 34 that is similar to the diameter 28 of the substrate 20. That is, in one embodiment, the oxide layer 32 substantially covers the entire upper surface 22 of the substrate 20. The oxide layer 32 has a thickness 36 of, for example, at least 4 µm, such as between 4 and 20 µm. In a preferred embodiment, the thickness 36 of the oxide layer 32 is between 4 and 6 µm, such as approximately 5 µm. The combination of the high resistivity silicon substrate 20 and the oxide layer 32, particularly with TEOS oxide which has a resistivity of approximately $1\times10^{15}$ ohm-cm, may be referred to as a "high resistivity silicon stack."

Figure 4:
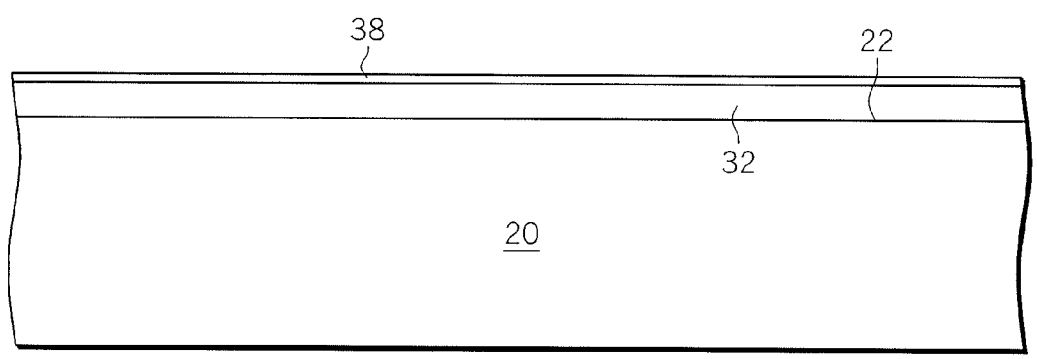
FIG. 4 is a cross-sectional side view of the semiconductor substrate of FIG. 3 with an adhesion layer formed over the oxide layer.

As shown in FIG. 4, an adhesion layer 38 is then formed on the oxide layer 32. In one embodiment, the adhesion layer 38 is made of silicon nitride (SiN) and is formed using CVD, such as plasma enhanced PECVD. The formation of the adhesion layer 38 may occur, or be performed, at processing temperatures below 550° C. Although not specifically shown, the adhesion layer 38 has a thickness of, for example, between 50 and 300 nanometers (nm) as measured over the upper surface 22 of the substrate 20.

Figure 5:
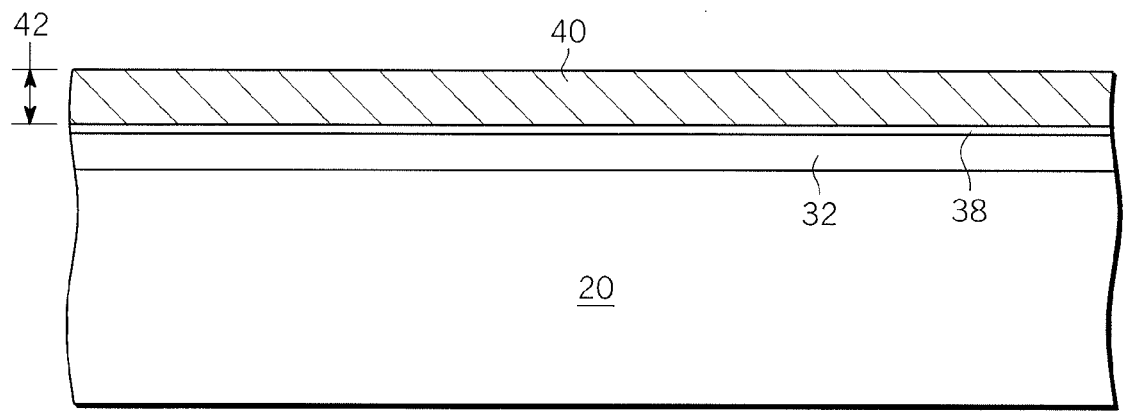
FIG. 5 is a cross-sectional side view of the semiconductor substrate of FIG. 4 with a first conductive layer formed over the adhesion layer.

As shown in FIG. 5, a first (or lower) conductive layer 40 is then formed on the adhesion layer 38. The lower conductive layer 40 is made of an electrically conductive material, such as aluminum (Al), copper (Cu), gold (Au), or any practical combination thereof (e.g., AlCu) and is formed using, for example, thermal or electron beam evaporation, physical vapor deposition (PVD), CVD, atomic layer deposition (ALD), or electroplating. The lower conductive layer 40 has a thickness 42 of, for example, between 0.5 and 1.5 µm.

Figure 6:
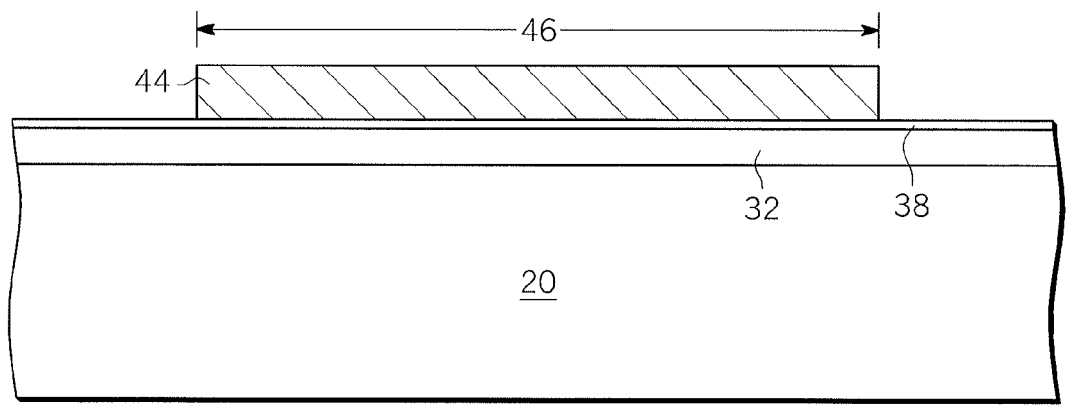
FIG. 6 is a cross-sectional side view of the semiconductor substrate of FIG. 5 after the first conductive layer has been patterned to form a first conductive plate.

Referring to FIG. 6, a first (or lower) conductive plate 44 is then formed from the first conductive layer 40. The first conductive plate 44 may be formed by processes well known in the art such as photoresist patterning and plating; physical deposition, patterning and etch; or photoresist patterning, metal evaporation, and lift-off in the case of gold metallization. In one embodiment, the first conductive plate 44 has a width 46 of, for example, between 5 and 10 µm which, depending on the desired capacitor value and manufacturing metal rules.

Figure 7:
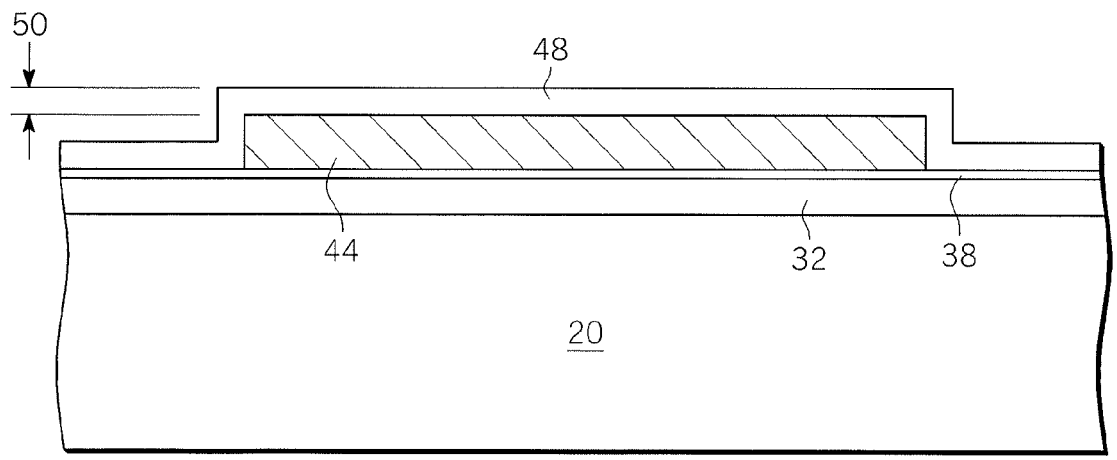
FIG. 7 is a cross-sectional side view of the semiconductor substrate of FIG. 6 with a dielectric layer formed over the first conductive plate.

Referring to FIG. 7, a dielectric layer 48 is then formed over the first conductive plate 44, as well as exposed portions of the adhesion layer 38. In one embodiment, the dielectric layer 48 is made of silicon nitride and is formed using, for example, CVD, PVD, and/or ALD. The dielectric layer 48 has a thickness 50 of, for example, between 5 and 300 nm.

Figure 8:
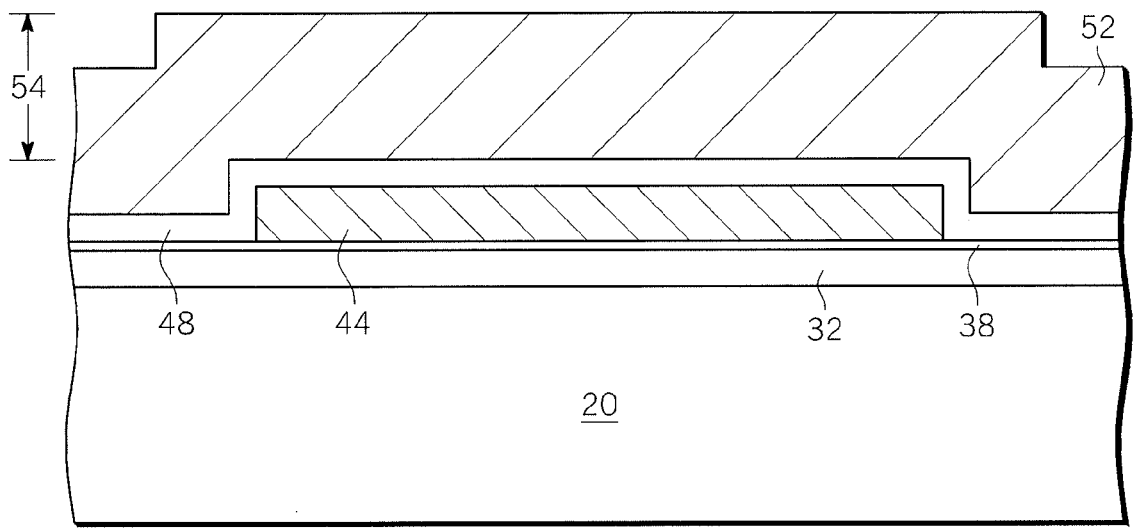
FIG. 8 is a cross-sectional side view of the semiconductor substrate of FIG. 7 with a second conductive layer formed over the dielectric layer.

As shown in FIG. 8, a second (or upper) conductive layer 52 is then formed over the dielectric layer 48. The upper conductive layer 52 is made of an electrically conductive material such as aluminum (Al), copper (Cu), gold (Au), or any combination thereof (e.g., AlCu) and is formed using, for example, thermal evaporation, PVD, CVD, ALD, or electroplating. The upper conductive layer 52 has a thickness 54 of, for example, between 1 and 15 µm.

Figure 9:
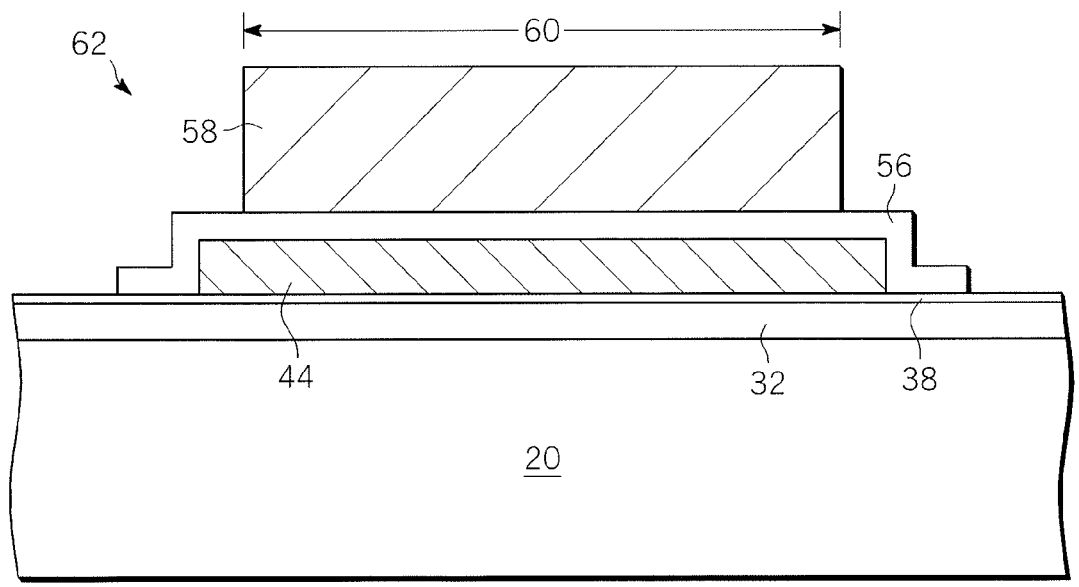
FIG. 9 is a cross-sectional side view of the semiconductor substrate of FIG. 8 after the second conductive layer and the dielectric layer have been patterned to form a second conductive plate and a dielectric body between the first and second conductive plates.

As illustrated in FIG. 9, the dielectric layer 48 and the upper conductive layer 52 are then patterned (and/or etched) to form a dielectric body 56 and a second (or upper) conductive plate 58 from the dielectric layer 48 and the upper conductive layer 52, respectively, over the first conductive plate 44. In the depicted embodiment, the dielectric body 56 covers the entire first conductive plate 44 while the second conductive plate 58 has a width 60 that is less than the width 46 (FIG. 6) of the first conductive plate 44. The width 60 of the second conductive plate 58 may be, for example, between 4 and 8 µm. The formation of the dielectric body 56 and the second conductive plate 58 may substantially complete the formation of an integrated, passive electronic component. In the particular exemplary embodiment shown in FIG. 9, the passive electronic component is a metal-insulator-metal (MIM) capacitor 62, as is commonly understood in the art.

Figure 10:
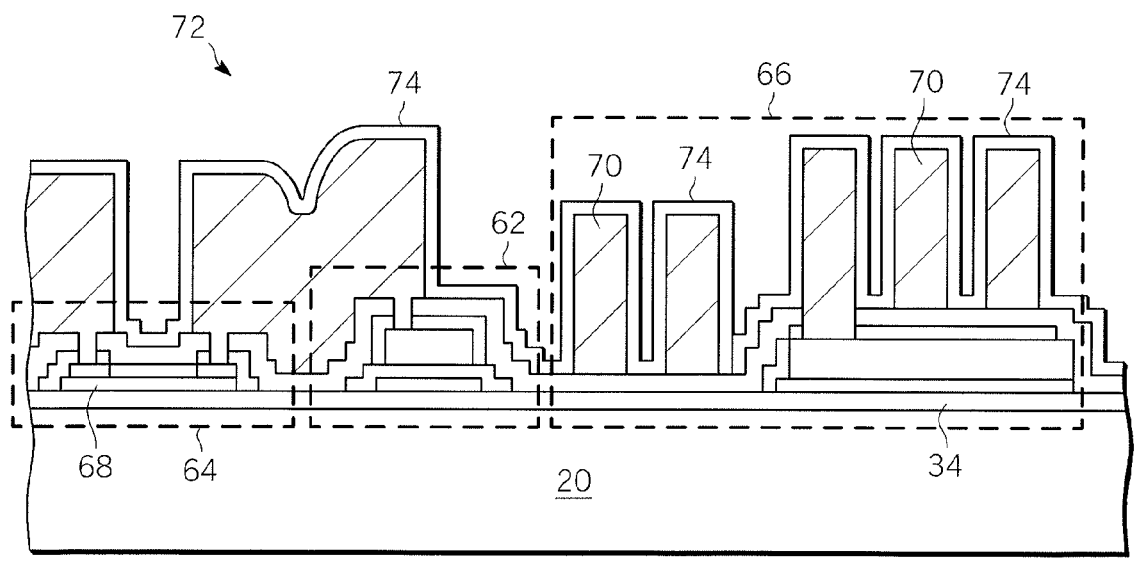
FIG. 10 is an expanded cross-sectional side view of the semiconductor substrate of FIG. 9 after the formation of multiple passive electronic components thereon thus forming a microelectronic assembly according to one embodiment of the present invention.

FIG. 10 is an expanded view of the portion of the substrate (or die 30) illustrated in FIGS. 2-9. As shown, other passive electronic components may also be formed on the substrate 20, such as thin film (TF) resistors 64 and inductors 66. The TF resistor 64 includes a resistive thin film 68 formed on the oxide layer 34. In one embodiment, the resistive thin film is made of titanium tungsten nitride (TiWN) with a thickness of, for example, between 100 nm and 300 nm and is formed on the oxide layer 34 by CVD. The inductor 66 includes a conductive coil 70 that is, for example, made of copper and/or gold with a thickness of between 1 and 15 µm and is formed using electroplating.

As will be appreciated by one skilled in the art, the TF resistor 64 and the inductor 66 may be at least partially formed during the same processing steps used to form the MIM capacitor 62 shown in FIGS. 2-9, such as the formation and etching of the first conductive layer 40 (FIGS. 5 and 6) and the second conductive layer (FIGS. 8 and 9). Although not specifically shown, multiple components, formed on the substrate 20 (e.g., capacitors 62, resistors 64, and inductors 66) may be coupled such that harmonic filters, couplers, switches and transformers are formed therefrom. The formation of the electronic components may substantially complete a microelectronic, or electronic, assembly (or IPD) 72 as shown in FIG. 10 formed on one of the dice 30 shown in FIG. 1. As also shown in FIG. 10, a passivation layer 74 (e.g., SiN) may be formed over all of the components on the substrate 20 to provide protection from environmental effects, such as moisture.

Figure 11:
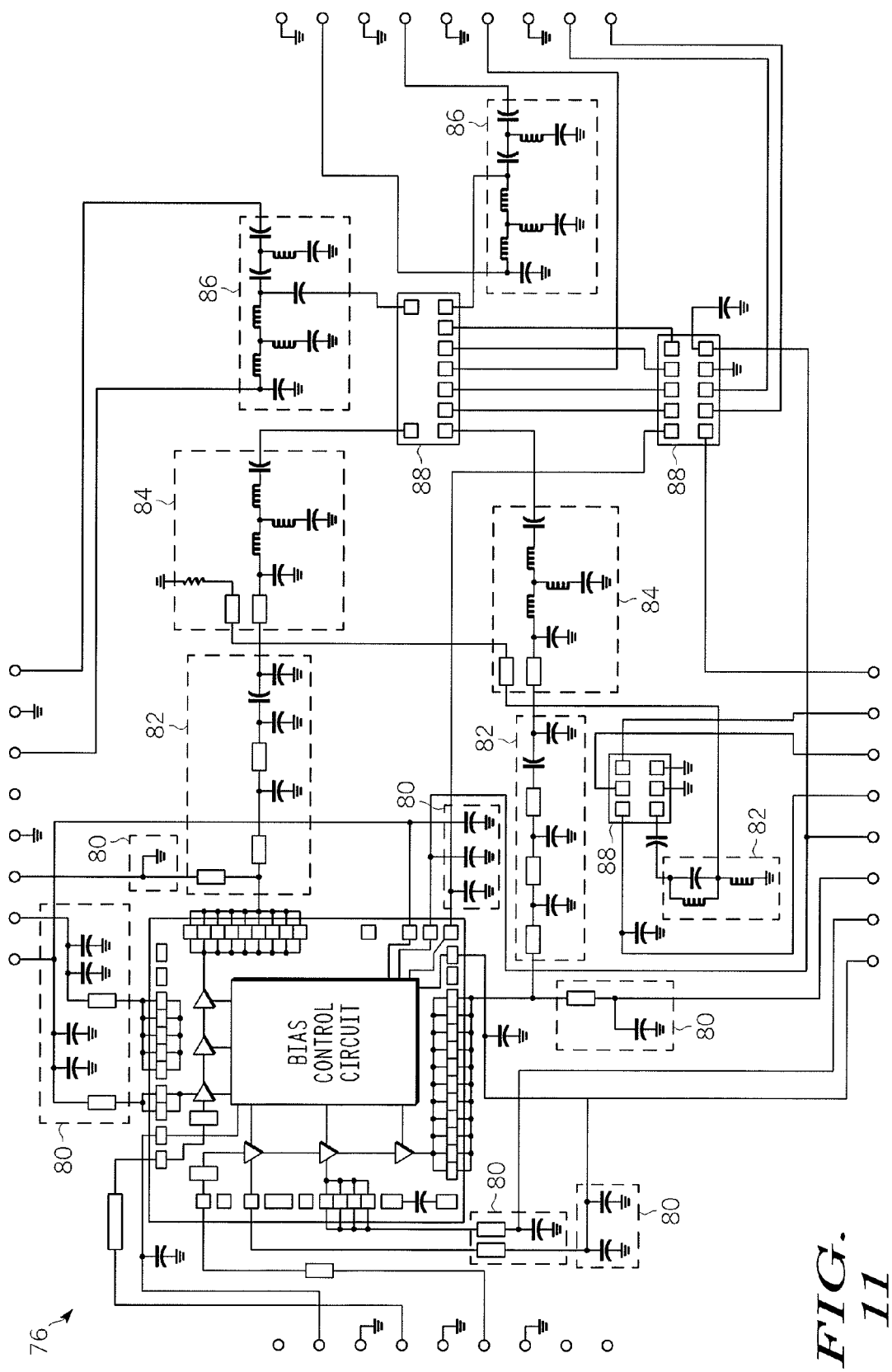
FIG. 11 is a schematic view of a power amplifier (PA) module in which the assembly of FIG. 10 may be utilized.

After final processing steps, which may include the formation of contact formations (e.g., solder balls) and conductors (e.g., wire bonds) interconnecting the electronic components and the contact formations, the substrate 20 may be sawed into the individual microelectronic dice 30, or IPDs, (shown in FIG. 10), or semiconductor chips, packaged, and installed in various electronic or computing systems. FIG. 11 schematically illustrates an exemplary power amplifier (PA) module 76 in which the dice 30 may be utilized. In the depicted embodiment, the PA module 76 includes a power amplifier (or power integrated circuit) 78, decoupling circuits 80, matching/tuning circuits 82, harmonic filters 84, diplexers 86, and control circuits 88.

Although not illustrated in detail, the power amplifier may be a "smart" power integrated circuit, as is commonly understood, and may include a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof.

One advantage of the IPD and method of forming an IPD described above is that the effective resistivity of the silicon substrate is increased because of the formation of the oxide layer, particularly given the thickness of the oxide layer. As a result, the substrate losses experienced by the IPD are minimized, and the overall RF performance of the IPD is improved. Another advantage is that because of the relatively low cost of silicon, especially when compared to gallium arsenide and sapphire, the overall manufacturing costs of the IPD are minimized without sacrificing performance. A further advantage is that because silicon is already commonly used in semiconductor manufacturing, the same processes and tools may be used to form the IPD without substantial modification. As a result, the manufacturing costs are even further reduced, especially when compared to glass and quartz substrates. An even further advantage is that because of the relatively low temperatures at which the oxide layer is formed, the high resistivity of the silicon substrate is maintained.

Figure 12:
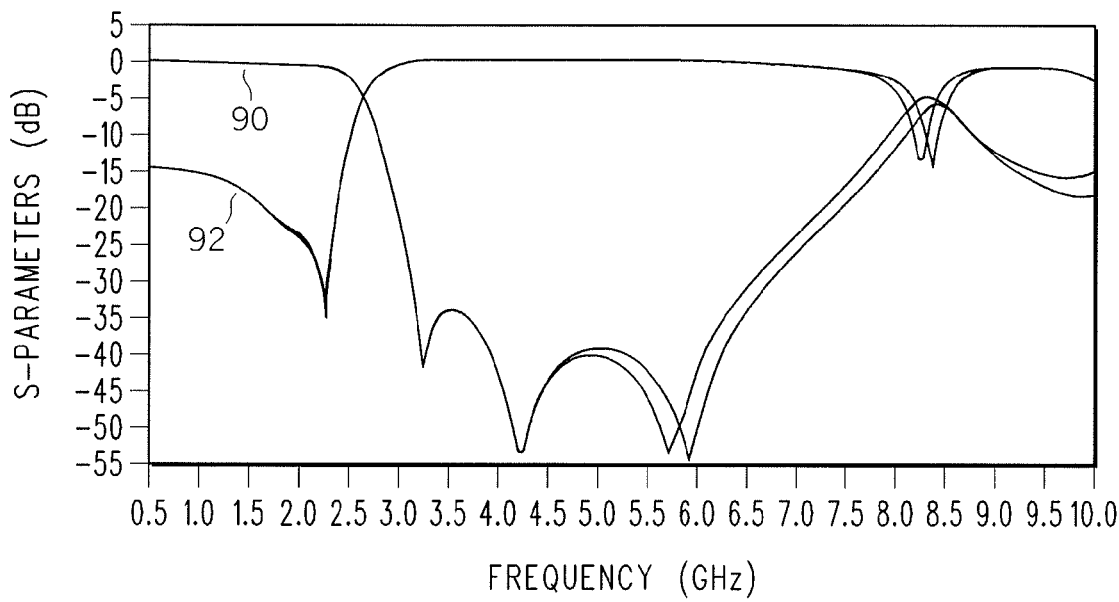
FIGS. 12-15 are graphical illustrations comparing the performance of integrated passive devices (IPDs) on a gallium arsenide substrate to that of IPDs on a substrate according to an embodiment of the present invention.
Figure 13:
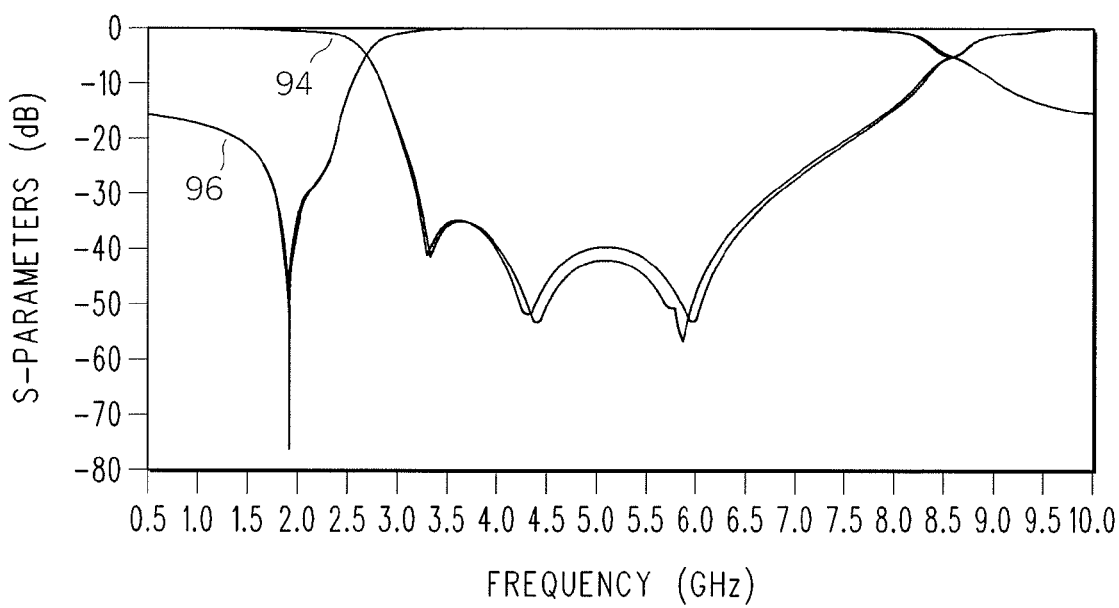
Figure 14:
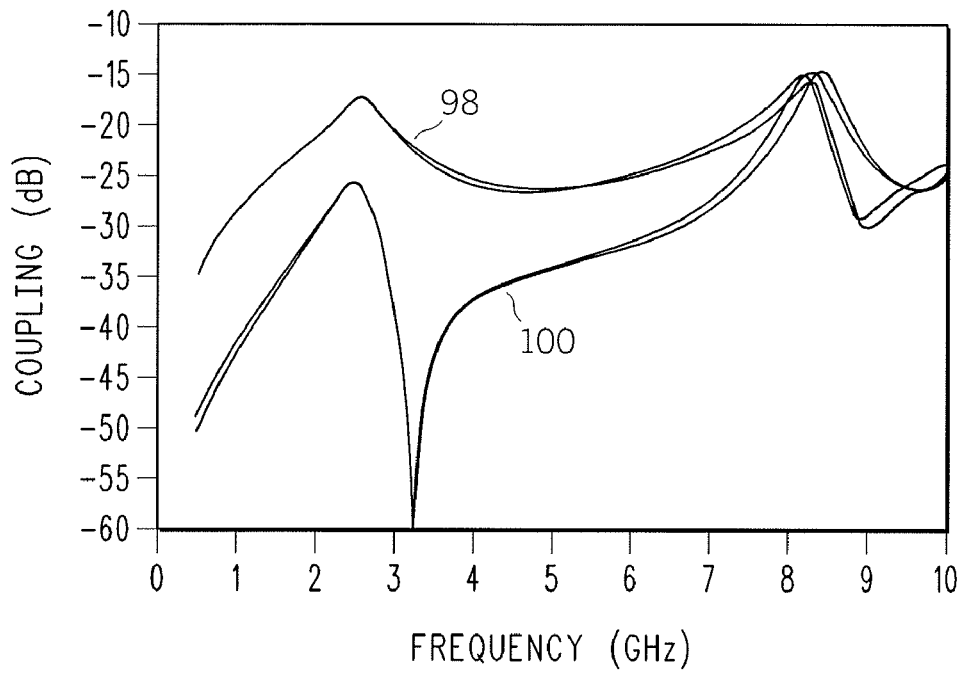
Figure 15:
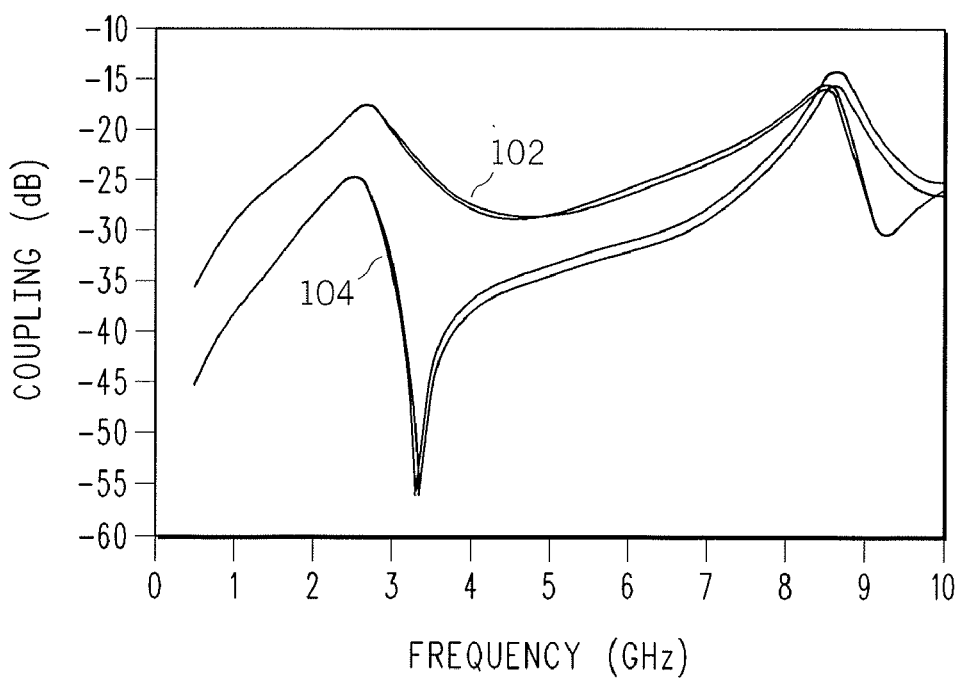

FIGS. 12-15 graphically illustrate the simulated performance of the silicon substrate described above compared to that of a conventional gallium arsenide substrate when used in an IPD with an integrated harmonic filter and a coupler. As will be apparent to one skilled in the art upon viewing FIGS. 12-15, the high resistivity silicon stack of the present invention performed very similarly to the convention gallium arsenide (GaAs) substrate both in terms of scattering parameters and coupling. In particular, FIG. 12 shows the insertion loss ($S_{21}$) 90 and return loss ($S_{11}$) 92 of two die from a GaAs substrate, while FIG. 13 shows the insertion loss 94 and return loss 96 for two die from a substrate according to an embodiment of the present invention. FIG. 14 shows the coupling as measured at the input ($S_{31}$) 98 and the coupling as measured at the output ($S_{32}$) for two die from a GaAs substrate. FIG. 15 shows the corresponding coupler results ($S_{31}$) 102 and ($S_{31}$) 104 for two die from a substrate according to an embodiment of the present invention. As shown in FIGS. 12-15, for example, over a radio frequency band of 1724 MHz to 1910 MHz, the insertion loss (90 in FIG. 12 and 94 in FIG. 13), harmonic rejections, $H_2$, $H_3$ and $H_4$, and coupling are comparable.

Other embodiments may use other dielectric materials deposited at low temperature and with low dielectric constants and high resistivity characteristics other than TEOS oxide, such as other silane based oxides and benzocyclobutene (BCB). As will be appreciated, other manufacturing processes may be used to form the various components described above. As previously mentioned, active electric components, such as transistors and other integrated circuit components may be formed on the silicon substrate in conjunction with the passive electronic components.

The invention provides a method of forming an IPD. An insulating dielectric layer having a thickness of at least 4 microns is formed over a silicon substrate. At least one passive electronic component is formed over the insulating dielectric layer.

The insulating dielectric layer may be an oxide layer, and the at least one passive electronic component may include at least one of a capacitor, a resistor, and an inductor. The oxide layer may include a silicon oxide. The at least one passive electronic component may include a plurality of passive electronic components.

The formation of the oxide layer may occur at a temperature that is less than approximately 550° C. The formation of the oxide layer may occur at a temperature that is between approximately 150° C. and 450° C.

The silicon oxide may include TEOS oxide. The thickness of the oxide layer may be between approximately 4 and 20 microns. The thickness of the oxide layer may be between approximately 4 and 6 microns. The silicon substrate may have a thickness of between approximately 25 and 800 microns and a resistivity of greater than 1000 ohm-cm.

The invention also provides a method for forming an integrated passive device. A silicon substrate with a resistivity greater than 1000 ohm-cm is provided. A silicon oxide layer having a thickness of at least 4 microns is formed over the silicon substrate. The formation of the silicon oxide layer occurs at a temperature that is less than 550° C. A plurality of passive electronic components is over the silicon oxide layer.

The silicon oxide layer may include TEOS oxide and may be formed using chemical vapor deposition. The plurality of passive electronic components may include at least one of a capacitor, a resistor, and an inductor.

The formation of the silicon oxide layer may occur at a temperature that is between approximately 150° C. and 450° C. The silicon substrate may have a thickness of between approximately 25 and 625 microns. The thickness of the oxide layer may be between approximately 4 and 6 microns.

The invention further provides a microelectronic assembly. The microelectronic assembly includes a silicon substrate with a resistivity of at least 1000 ohm-cm, a silicon oxide layer having a thickness of at least 4 microns formed over the silicon substrate, and a plurality of passive electronic components formed over the silicon oxide layer.

The silicon oxide layer may include TEOS oxide and the thickness of the silicon oxide layer may be between 4 and 6 microns. The plurality of passive electronic components may include at least one of a capacitor, a resistor, and an inductor. The plurality of passive electronic components may jointly form a harmonic filter. The microelectronic assembly may include integrated circuit coupled to the plurality of passive electronic components.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of forming an integrated passive device (IPD) comprising:
   forming an oxide layer having a thickness of at least 4 micrometers over a silicon substrate, said formation of the oxide layer occurring at a temperature that is less than 550° C., wherein the oxide layer comprises tetraethyl orthosilicate (TEOS) oxide;
   forming a plurality of passive electronic components over the oxide layer, wherein the plurality of passive electronic components jointly form a harmonic filter; and
   forming a passivation layer over the oxide layer and the plurality of passive electronic components.

2. The method of claim 1, further comprising installing the IPD in a computing system.

3. The method of claim 2, wherein the passivation layer comprises silicon nitride.

4. The method of claim 3, wherein the thickness of the oxide layer is between approximately 4 and 6 micrometers.

5. The method of claim 4, wherein the silicon substrate has a thickness of between approximately 25 and 800 micrometers and a resistivity of greater than 1000 ohm-cm.

6. A method of forming an integrated passive device (IPD) comprising:
   forming an oxide layer having a thickness of at least 4 micrometers over a silicon substrate, said formation of the oxide layer occurring at a temperature that is less than 550° C., wherein the oxide layer comprises tetraethyl orthosilicate (TEOS) oxide;
   forming a plurality of passive electronic components over the oxide layer, wherein the plurality of passive electronic components comprises a capacitor, a resistor, an inductor, or a combination thereof, and wherein the plurality of passive electronic components jointly form a harmonic filter; and
   forming a passivation layer over the oxide layer and the plurality of passive electronic components.

7. The method of claim 6, wherein said formation of the oxide layer occurs at a temperature that is between approximately 150° C. and 450° C.

8. A method for forming an integrated passive device (IPD) comprising:
   providing a silicon substrate with a resistivity that is greater than 1000 ohm-cm;
   forming a tetraethyl orthosilicate (TEOS) oxide layer having a thickness of at least 4 micrometers over the silicon substrate, wherein forming the TEOS oxide layer occurs at a temperature that is less than 550° C.;
   forming a plurality of passive electronic components over the TEOS oxide layer after forming the TEOS oxide layer, wherein the plurality of passive electronic components jointly form a harmonic filter; and
   forming a passivation layer over the plurality of passive electronic components and the TEOS oxide layer after forming the plurality of passive electronic components.

9. The method of claim 8, wherein the passivation layer comprises silicon nitride.

10. The method of claim 9, wherein the plurality of passive electronic components comprises a capacitor, a resistor, an inductor, or a combination thereof, and wherein forming the plurality of passive electronic components comprises:
    forming a first conductive layer over the TEOS oxide layer; and
    forming a second conductive layer over the first conductive layer.

11. The method of claim 10, wherein the temperature is between approximately 150° C. and 450° C.

12. The method of claim 11, wherein the silicon substrate has a thickness of between approximately 25 and 625 micrometers and the thickness of the TEOS oxide layer is between approximately 4 and 6 micrometers.

13. A microelectronic assembly comprising:
    a silicon substrate with a resistivity of at least 1000 ohm-cm;
    a tetraethyl orthosilicate (TEOS) oxide layer having a thickness of at least 4 micrometers formed over the silicon substrate;
    a plurality of passive electronic components formed over the TEOS oxide layer, wherein the plurality of passive electronic components jointly form a harmonic filter; and
    a passivation layer formed over the TEOS oxide layer and the plurality of passive electronic components to provide protection from environmental elements.

14. The microelectronic assembly of claim 13, wherein the thickness of the TEOS oxide layer is between 4 and 6 micrometers.

15. The microelectronic assembly of claim 14, wherein the plurality of passive electronic components comprises a capacitor, a resistor, an inductor, or a combination thereof.

16. The microelectronic assembly of claim 15, further comprising an integrated circuit coupled to the plurality of passive electronic components.

17. The microelectronic assembly of claim 13, wherein the passivation layer comprises silicon nitride.

* * * * *